United States Patent [19]

Thackeray et al.

[11] Patent Number: 5,128,232
[45] Date of Patent: Jul. 7, 1992

[54] PHOTORESIST COMPOSITION WITH COPOLYMER BINDER HAVING A MAJOR PROPORTION OF PHENOLIC UNITS AND A MINOR PROPORTION OF NON-AROMATIC CYCLIC ALCOHOLIC UNITS

[75] Inventors: James Thackeray, Braintree; George W. Orsula, Tewksbury; Roger Sinta, Woburn, all of Mass.

[73] Assignee: Shiply Company Inc., Newton, Mass.

[21] Appl. No.: 354,800

[22] Filed: May 22, 1989

[51] Int. Cl.⁵ .................. G03C 1/52; G03C 1/492
[52] U.S. Cl. .................. 430/192; 430/193; 430/270; 430/326; 430/909; 430/905
[58] Field of Search ........ 430/192, 270, 326, 193, 430/905, 909

[56] References Cited

U.S. PATENT DOCUMENTS

| | | | |
|---|---|---|---|
| 4,148,654 | 4/1979 | Oddi | 430/270 |
| 4,439,516 | 3/1984 | Carnigliaro et al. | 430/326 |
| 4,506,006 | 3/1985 | Ruckert et al. | 430/192 |
| 4,576,901 | 3/1986 | Stahlhofen et al. | 430/192 |
| 4,678,737 | 7/1987 | Schneller et al. | 430/192 |
| 4,720,445 | 1/1988 | Brahim et al. | 430/192 |
| 4,857,435 | 8/1989 | Hopf et al. | 430/192 |

FOREIGN PATENT DOCUMENTS

| | | |
|---|---|---|
| 0164248 | 5/1985 | European Pat. Off. |
| 0209956 | 7/1986 | European Pat. Off. |
| 0232972 | 1/1987 | European Pat. Off. |

Primary Examiner—Richard L. Schilling
Assistant Examiner—Christopher G. Young

[57] ABSTRACT

A photoresist that utilizes a copolymer of a phenol and a cyclic alcohol having increased optical transmission properties relative to photoresists using fully aromatic phenolic resins. Preferred binders are hydrogenated novolak resins and hydrogenated polyvinyl phenol resins.

19 Claims, 3 Drawing Sheets

PHOTORESIST COMPOSITION WITH COPOLYMER BINDER HAVING A MAJOR PROPORTION OF PHENOLIC UNITS AND A MINOR PROPORTION OF NON-AROMATIC CYCLIC ALCOHOLIC UNITS

BACKGROUND OF THE INVENTION

1. Introduction

This invention relates to photoresists exhibiting decreased absorbency of light at activating wavelengths. More particularly, this invention relates to photoresists that utilize phenolic resin binders having lowered intrinsic optical absorbency.

2. Description of the Prior Art

Photoresists are photosensitive films used for transfer of an image to a substrate. They may be negative or positive acting. After a coating of a photoresist is formed on a substrate, the coating is selectively exposed through a photomask to a source of activating energy such as ultraviolet light. The photomask has areas that are opaque to activating radiation and other areas that are transparent to activating radiation. The pattern in the photomask of opaque and transparent areas define a desired image to be transferred to a substrate.

In the case of a negative photoresist, exposed portions of a photoresist coating become less soluble in a developer as the result of a photochemical reaction, thereby resulting in differential solubility between the exposed and unexposed portions. This difference in solubility allows for the selective removal of unexposed portions of the photoresist coating and the subsequent transfer of an image to a substrate.

In the case of a positive acting photoresist, exposed portions of the photoresist coating become more soluble in developer than unexposed portions as the result of a photochemical reaction allowing for selective removal of exposed areas by development.

Following development of a photoresist coating, portions of the substrate bared by development may be altered such as by etching. The historical background, types and processing of conventional photoresists are described by Deforest, *Photoresist Materials and Processes,* McGraw Hill Book Company, New York, Chapter 2, 1975 and by Moreau, *Semiconductor Lithography, Principles, Practices and Materials,* Plenum Press, New York, Chapters 2 and 4, 1988, both incorporated herein for their teaching of photoresist compositions and methods of making and using the same.

Most commercial photoresist formulations, both positive and negative, comprise a film forming binder and a light sensitive component. Many of these film forming binders are phenolic resins. For example, most positive acting photoresists currently in commercial use comprise a novolak resin and a naphthoquinone diazide sulfonic acid ester photoactive compound where the novolak resin is the reaction product of formaldehyde and a phenol. Examples of such photoresists are disclosed in U.S. Pat. Nos 4,377,631 and 4,404,272, incorporated herein by reference. Another class of positive acting photoresists comprise a polyvinyl phenol and a naphthoquinone diazide sulfonic acid ester. Examples of these photoresists are disclosed in U.S. Pat. Nos. 3,869,292 and 4,439,516, both incorporated herein by reference.

Many negative acting photoresists also utilize phenolic resins as the film-forming component of the photoresist. One such photoresist forms a negative image by image reversal. Photoresists capable of image reversal are positive acting photoresists, such as those described above, to which an image reversal agent, such as hexamethylolmelamine hexamethyl ether is added. Such a photoresist is disclosed in U.S. Pat. No. 4,581,321, incorporated herein by reference. Another negative acting photoresist employing a phenolic binder is disclosed in European patent application serial No. 0232972, incorporated herein by reference. The photoresist disclosed in this patent uses a photoacid generator sensitive to selective wavelengths of activating energy including deep U.V., a crosslinking agent, and a phenolic, acid hardening, polymeric binder. In the presence of activating radiation, the photoacid generator is cleaved generating a strongly acidic environment. Upon subsequent heating, the generated acid activates the crosslinking agent to form a base insoluble negative image in an image pattern.

An important property of a photoresist is image resolution. Whether the photoresist is positive or negative acting, a developed image of fine line definition having vertical side-walls is highly desired to permit transfer of the fine line image to an underlying substrate. Another important property of a photoresist is photospeed. Enhanced photospeed is especially important in applications where a number of exposures are needed, for example, in generating multiple patterns by a step and repeat process, or where activating energy of reduced intensity is employed. Increased photospeed also permits reduction in the light sensitive component of the photoresist and/or a decrease in the required energy of exposure for image formation.

Prior art photoresists have adequate line definition and photospeed for many commercial applications. However, the art is continuously seeking methods to improve each of these properties.

SUMMARY OF THE INVENTION

It is known that aromatic materials absorb light energy at certain wavelengths of light through their conjugated bonds. Therefore, it is not unexpected that the phenolic resins used as binders for photoresists absorb light energy at those wavelengths used to expose the photoresists, especially within the deep U.V. range. Recognizing the above, the subject invention achieves decreased absorbency of light at activating wavelengths by providing a photoresist binder that is a copolymer of a phenol and a cyclic alcohol. The copolymer has the properties required of a photoresist binder but contains fewer conjugated bonds compared to a fully aromatic polymer.

Various methods may be used to form the copolymer of the phenol and the cyclic alcohol. One method comprises copolymerizing the cyclic alcohol with the phenol. A preferred method involves hydrogenation of a preformed phenolic resin. By either method, the result is a copolymer having phenolic and cyclic alcohol repeating units where the ratio of the phenolic units to the cyclic alcohol units is dependent upon the number of cyclic alcohol groups copolymerized with the phenol or the number of conjugated bonds destroyed by hydrogenation.

By using a copolymer of a cyclic alcohol and a phenol in place of a phenolic polymer in the formulation of a photoresist, less energy is absorbed by the binder during exposure and therefore, given a constant exposure energy, more energy is available for activation of the radiation sensitive component of the photoresist.

The copolymer of the invention may be used in substitution for a phenolic resin in substantially any prior art photoresist where a phenolic resin is used as a binder. However, there is a maximum to the ratio of phenolic to cyclic alcohol units in the copolymer if the copolymer is to be used to formulate a photoresist. The maximum ratio is dependent upon the particular composition of the photoresist. The limit on this ratio is due to reduced solubility of a photoresist due to the introduction of cyclic alcohol units into the resin binder. Recognizing that following exposure, photoresists require differential solubility for development, routine experimentation may be required to determine the maximum permissible ratio of cyclic alcohol to phenolic units in a resin copolymer binder for any specific photoresist composition.

The improvements resulting from the use of the copolymers of a cyclic alcohol and a phenol as a photoresist binder will vary for differing photoresists dependent upon the energy required for activation. For example, it is known that the greatest absorption by a conjugated bond is within the deep U.V. range. Therefore, use of the copolymer described herein as a binder for a photoresist activated by deep U.V. exposure is more efficacious than use of the same copolymer in a photoresist activated at an exposure energy other than deep U.V.

The use of the copolymer described herein in a photoresist formulation results in decreased light absorption during exposure of the photoresist to activating radiation. This results in increased photospeed. In addition, it has been found that photoresists using the subject copolymer exhibit improved image resolution following development. Relief images formed using photoresists of the invention are capable of fine line resolution and possess vertical side walls known by the art to be highly desirable for transfer of fine line images to underlying substrates.

In accordance with the invention, the copolymer of the phenol and the cyclic alcohol is preformed prior to admixture of the resin with the remaining photoresist components. Following formation of the copolymer, the photoresist is prepared and used in conventional manner with process modification to account for increased photospeed arising from decreased absorption of activating radiation and for modified solubility properties.

DESCRIPTION OF PREFERRED EMBODIMENTS

Figure 1:
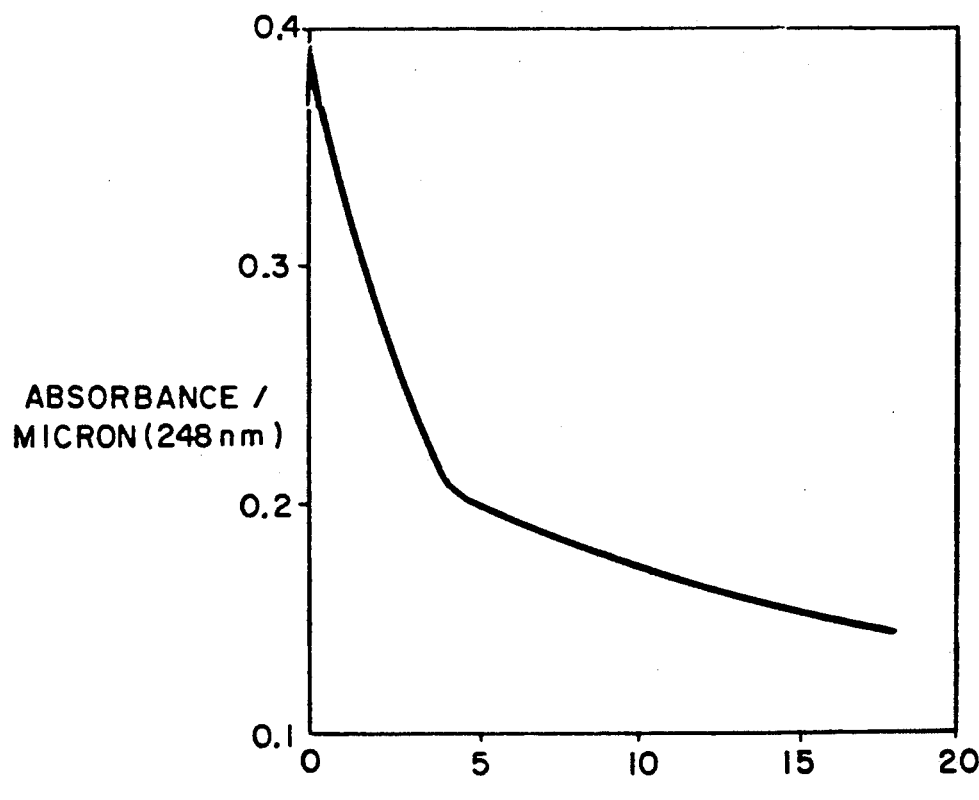
FIG. 1 is a graphical representation of the absorbency characteristics of a hydrogenated polyvinyl phenol at 248 nm as a function of the percent hydrogenation of said resin.

As discussed above, the invention comprises photoresists that use copolymers of a phenol and a cyclic alcohol as a binder. The preferred copolymers for purposes of this invention are those formed by the hydrogenation of a phenol formaldehyde (novolak) or a polyvinyl phenol resin.

Procedures for the preparation of conventional novolak and polyvinyl phenol resins used as photoresists binders are well known in the art and disclosed in numerous publications including those discussed above. Novolak resins are the thermoplastic condensation products of a phenol and an aldehyde. Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Polyvinyl phenol resins are thermoplastic polymers that may be formed by block polymerization, emulsion polymerization or solution polymerization of the corresponding monomers in the presence of a cationic catalyst. Vinylphenols useful for the production of polyvinyl phenol resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinyl phenol resins prepared from such vinylphenols have a molecular weight range of from about 2,000 to about 60,000 daltons.

Preferred resins for purposes of this invention are copolymers of phenols and cyclic alcohols analogous in structure to the novolak resins and polyvinyl phenol resins. These copolymers may be formed in several ways. For example, in the conventional preparation of a polyvinyl phenol resin, a cyclic alcohol may be added to the reaction mixture as a comonomer during the polymerization reaction which is thereafter carried out in normal manner. The cyclic alcohol is preferably aliphatic, but may contain one or two double bonds. The cyclic alcohol is preferably one closest in structure to the phenol. For example, if the resin is a polyvinyl phenol, the comonomer would be vinyl cyclohexanol.

The preferred method for formation of the copolymer comprises hydrogenation of a preformed novolak resin or a preformed polyvinyl phenol resin. Hydrogenation may be carried out using art recognized hydrogenation procedures, for example, by passing a solution of the phenolic resin over a reducing catalyst such as a platinum or palladium coated carbon substrate or preferably over Raney nickel at elevated temperature and pressure. The specific conditions are dependent upon the polymer to be hydrogenated. More particularly, the polymer is dissolved in a suitable solvent such as ethyl alcohol or acetic acid, and then the solution is contacted with a finely divided Raney nickel catalyst and allowed to react at a temperature of from about 100° to 300° C. at a pressure of from about 50 to 300 atmospheres or more. The finely divided nickel catalyst may be a nickel-on-silica, nickel-on-alumina, or nickel-on-carbon catalyst depending upon the resin to be hydrogenated. Hydrogenation is believed to reduce the double bonds in some of the phenolic units resulting in a random copolymer of phenolic and cyclic alcohol units interspersed in the polymer in percentages dependent upon the reaction conditions used.

Regardless of the manner in which the copolymer is formed, it will be a copolymer having a structure selected from the group:

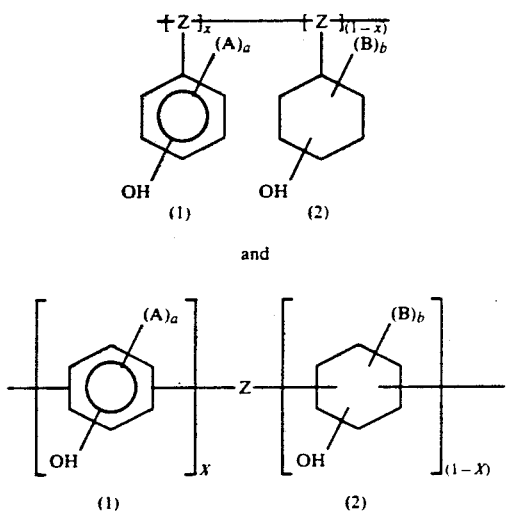

where unit (1) represents a phenolic unit and unit (2) represents a cyclic alcohol unit; (Z) is an alkylene bridge having from 1 to 3 carbon atoms; A is a substituent on the aromatic ring replacing hydrogen such as lower alkyl having from 1 to 3 carbon atoms, halo such as chloro or bromo, alkoxy having from 1 to 3 carbon atoms, hydroxyl, nitro, amino, etc.; a is a number varying from 0 to 3; B is a substituent such as hydrogen, lower alkyl having from 1 to 3 carbon atoms, halo such as chloro or bromo, alkoxy having from 1 to 3 carbon atoms, hydroxyl, nitro, amino, etc. provided that at least 3 of said B substituents are hydrogen; b is an integer varying between 6 and 10; and X is the mole fraction of the units (1) in the copolymer and varies between 0.50 and 0.99. From the formula, it can be seen that the percentage of cyclic alcohol units does not exceed 50 mole percent of the total polymer. More preferably, the cyclic alcohol units varies from about 1 to 30 mole percent and most preferably, from about 5 to 15 mole percent of the polymer. In no event should the percentage of cyclic alcohol units be so high as to prevent development of the photoresist following exposure of the same to activating radiation.

One preferred class of photoresists of this invention are those positive working photoresists that use the copolymer of the phenol and cyclic alcohol as a binder and an o-quinone diazide sulfonic acid ester as a photosensitizer. The sensitizers most often used in such photoresists are naphthoquinone diazide sulfonic acids such as those disclosed by Kosar, *Light Sensitive Systems*, John Wiley & Sons, 1965, pp. 343 to 352, incorporated herein as reference. These sensitizers form an acid in response to radiation of different wavelengths ranging from visible to X-ray. Thus, the sensitizer chosen will depend, in part, upon the wavelength used for exposure. By selecting the appropriate sensitizer, the photoresists can be imaged by deep U.V., E-beam, laser or any other activating radiation conventionally used for imaging photoresists. Preferred sensitizers include the 2,1,4-diazonaphthoquinone sulfonic acid esters and the 2,1,5-diazonapthoquinone sulfonic acid esters.

Though the aforesaid photoresists are a preferred class of photoresists in accordance with the invention, the results obtained using these photoresists are less dramatic than the results obtained with the more preferred photoresists described below because absorption at the activating radiations required for these photoresists is less pronounced than with photoresists activated by deep U.V. exposure.

More preferred photoresists in accordance with this invention are those positive and negative acting photoresists described in EPO Application Serial No. 0 232 972, supra, where the photoresist has a partially hydrogenated phenolic binder substituted for the fully aromatic phenolic binders disclosed in the said application (hereafter the "Acid Hardening Resists"). The Acid Hardening Resists comprise:

(a) an acid-hardening resin;
(b) an aminoplast or phenolplast; and
(c) a halogenated, organic, photoacid generating compound which:
  (i) selectively absorbs actinic radiation having a wave length in the range of about 350 nm or less,
  (ii) is compatible with the acid-hardening resin and the aminoplast or phenolplast;
  (iii) is developable in an aqueous based solution;
  (iv) is capable, on exposure to actinic radiation having a wavelength in the range of about 350 nm or less, of generating halogen acid for crosslinking the acid-hardening resin system at elevated temperatures to form a thermally stable negative image.

The aforesaid EPO Application discloses the acid-hardening resin and the aminoplast or phenolplast as an acid-hardening system. Novolak resins and polyvinyl phenol resins are disclosed as suitable acid hardening components of the acid-hardening resin system. A complete disclosure of the acid-hardening resin systems is disclosed in detail in EPO application No. 0 164 248, incorporated herein by reference. Suitable acid-hardening resin systems that can be combined with the photoacid generators described in EPO Application Serial No. 0 232 972 contain a polymer that cross-links in the presence of an acid catalyst and heat. As described in the EPO Application, the acid-hardening resin system may be prepared from a variety of aminoplasts or phenolplasts in combination with compounds of low molecular weight polymers containing a plurality of hydroxyl, carboxyl, amide or imide groups. Suitable aminoplasts include urea formaldehyde; melamine formaldehyde; benzoguanamine formaldehyde; glycouril formaldehyde resins; and combinations thereof.

In accordance with the aforesaid EPO Application, the aminoplasts are used in combination with a reactive hydrogen containing compound such as a novolak resin; polyvinyl phenol; polyglutarimide; poly(meth)acrylic acid copolymer; alkali soluble polyacrylamide and polymethacrylamide copolymers; copolymers containing 2-hydroxyethyl acrylate or methacrylate; polyvinyl alcohols such as those prepared from partially hydrolyzed polyvinyl acetate; alkali soluble styrene allyl alcohol copolymers; and mixtures thereof. Preferred reactive hydrogen containing resins for the subject invention are hydrogenated novolak resins and polyvinyl phenol resins containing hydroxyl groups which are sites for the electrophillic substitution of aromatic rings at positions ortho or para relative to the hydroxyl group.

Suitable halogenated, organic, photoacid generating compounds disclosed in the EPO Application as suitable for use with the acid hardening resin systems and suitable for purposes of this invention include:

1,1-bis [p-chlorophenyl]-2,2,2-trichloroethane (DDT);
1,1-bis [p-methoxyphenyl]-2,2,2-trichloroethane;
1,2,5,6,9,10-hexabromocyclododecane;
1,10-dibromodecane;
1,1-bis[p-chloropehnyl]-2,2-dichloroethane;
4,4'-dichloro-2-(trichloromethyl) benzhydrol (Kelthane); hexachlorodimethyl sulfone;
2-chloro-6-(trichloromethyl) pyridine;
0,0-diethyl-0-(3,5,6-trichloro-2-pyridyl)phosphorothionate;
1,2,3,4,5,6-hexachlorocyclohexane;
N(1,1-bis [p-chlorophenyl]-2,2,2-trichloroethyl)-acetamide;
tris [2,3-dibromopropyl] isocyanurate;
2,2-bis [p-chlorophenyl]-1,1-dichloroethylene;
tris [trichloromethyl] s-triazine;
and their isomers, analogs, homologs, and residual compounds.

The most preferred photoresists of this invention are those Acid Hardening Resists that are liquid coating compositions that are the positive and negative acting photoresists described in the EPO Application where the photoresist has a hydrogenated polyvinyl phenol binder in a concentration of from about 50.0 to 98.0 parts by weight, an aminoplast that is a melamine formaldehyde resin in a concentration of from about 1.0 to 25.0 parts by weight and an organic photoacid generating compound which is in a concentration of from about 0.5 to 25 parts by weight with a solids content of from about 10 to 40 weight percent.

In addition to the photoresist components described above, other conventional additives known to the art may be added to the photoresists of this invention. Such additives typically include dyes, adhesion promoting agents, solubility modifiers, other resins for specific purposes, materials to improve chemical resistance, flexibility, etch resistance, electrical properties, coating characteristics, exposure speed, development and resolution characteristics, etc.

Figure 2:
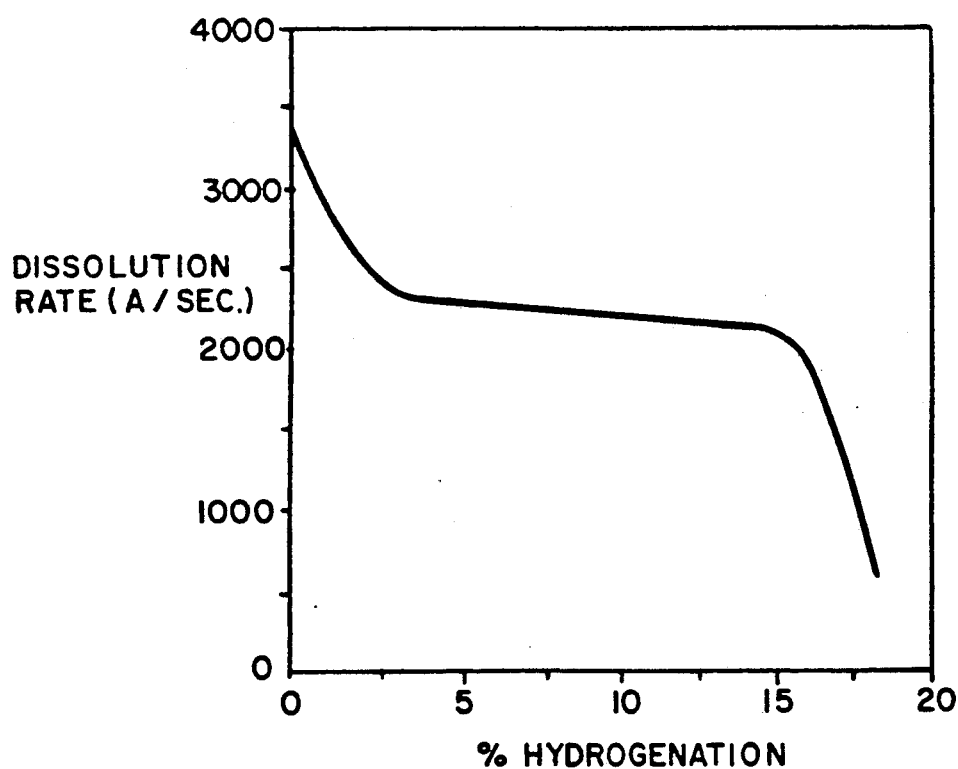
FIG. 2 is a graphical representation of the dissolution rate of a hydrogenated polyvinyl phenol as a function of the percent hydrogenation of said resin.

Use of a copolymer of a phenol and a cyclic alcohol as a resin binder for a photoresist in accordance with the invention improves optical properties because the binder contains fewer conjugated bonds, it being known that such bonds absorb at activating radiation, especially at a wavelength below 350 nm. In addition, it is believed that optical properties are improved due to elimination of quinone type impurities in said resins when hydrogenation is the means selected to form the copolymer. The improvements in optical properties are depicted in the drawings where FIG. 1 is a graphical representation of absorbancy of polyvinyl phenols having a varying percent hydrogenation at a wavelength of 248 nm and graphically depicts the results of Example 1 below. FIG. 2 of the drawings shows dissolution rate of a polyvinyl phenol as a function of percent hydrogenation and depicts the results of Example 2 below.

Figure 4:
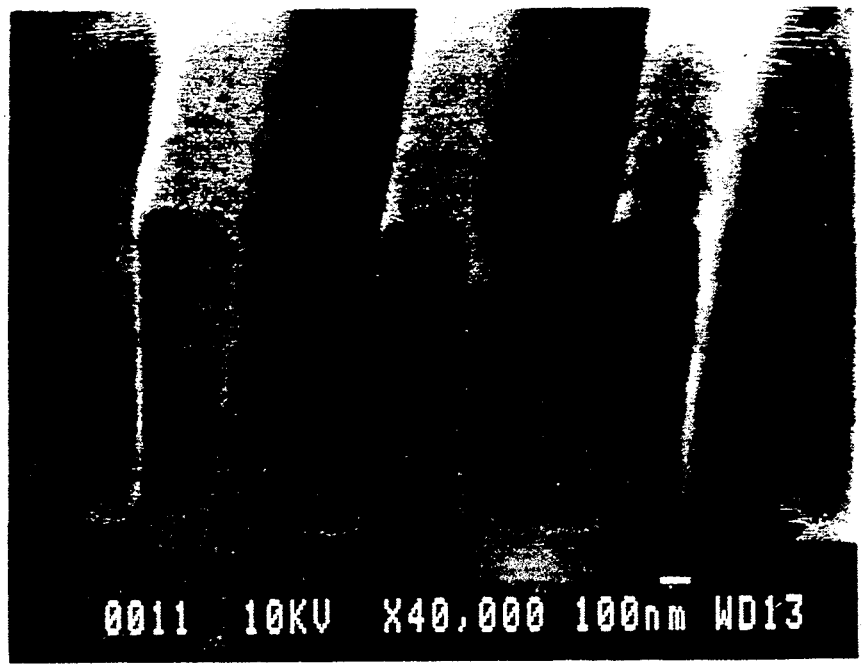
FIG. 4 is an SEM micrograph of a developed image formed in a photoresist prepared in accordance with the invention.

Use of the copolymer of the phenol and the cyclic resin also provides another advantage. Following exposure and development of a photoresist prepared in accordance with the invention, the relief image generated is of improved resolution and possesses an improved profile. The relief image possesses substantially vertical side walls and is capable of reproducing submicron features. This is illustrated in FIG. 4 of the drawings which is discussed in detail in Example 4 below.

The photoresists of the invention are prepared following prior art procedures with the exception that the copolymer binder described above is substituted for the conventional resins used in the formulation of such photoresists. Otherwise, the photoresists of the invention use prior art ingredients and concentrations of components. The photoresist is prepared as a coating composition by dissolving the components of the photoresist in a suitable solvent such as, for example, a glycol ether such as 2-methoxyethyl ether (diglyme), ethylene glycol monomethyl ether, ethylene glycol monomethyl ether, propylene glycol monomethyl ether; a Cellosolve ester such as methyl Cellosolve Acetate; an aromatic hydrocarbon such as toluene or xylene; or a ketone such as methylethyl ketone. Typically, the solids content of the photoresist varies between about 5 and 35 percent by weight of the total weight of the photoresist composition.

The photoresists of the invention are used in accordance with prior art procedures though exposure and development conditions may vary as a consequence of improved photospeed and altered solubility in developer. Though the photoresists of the invention may be applied as a dry film, they are preferably applied as a liquid coating, dried, exposed and developed with an aqueous alkali developer. A specific negative process for use of the preferred Acid Hardening Resists of the invention includes the steps of coating the photoresist over a surface and then:

(a) heating the so formed photoresist coating to form a dry coating having a thickness of several microns, preferably at a temperature of from about 70° C. to 110° C.;
(b) exposing at least one portion of the coating to a source of actinic radiation having a wavelength in the range of about 350 nm or less, preferably at a wavelength of 248 nm, using an excimer laser and an exposure dose of 100 mJ/cm$^2$ or less;
(c) baking at a temperature of from about 80° C. to about 160° C. for a time sufficient to crosslink the photoresist;
(d) developing unexposed portions of the coating with an aqueous based alkaline developer; and
(e) blanket exposing to activating radiation or baking at a temperature of about 200° C. to further crosslink the photoresist and increase its thermal stability.

The following examples are illustrative of the invention:

EXAMPLE 1

This Example shows the decreased absorbancy of deep ultraviolet radiation as a result of hydrogenation of a polyvinyl phenol resin. Measurements were carried out under conditions corresponding to use of the resin in a photoresist.

Four resins were used: a poly(p-vinyl phenol) of molecular weight approximately 5000 daltons; and three partially hydrogenated poly(p-vinyl phenol), also of approximately 5000 daltons. The poly(p-vinyl phenol) resins were obtained from Maruzen Oil Company of Tokyo, Japan. The degree of hydrogenation of the partially hydrogenated poly(p-vinyl phenols), expressed as % of aromatic double bonds converted to single bonds, or equivalently as % of hydroxyphenyl groups converted to hydroxycyclohexyl groups, was determined by NMR spectroscopy. For the three hydrogenated poly(p-vinyl phenols), these were 4%, 11%, and 18%.

The resins were dissolved at a concentration of 25% by weight in diethylene glycol dimethyl ether (referred to by its tradename diglyme). Each solution was filtered through a 0.2 micron filter, then spin-coated onto a 3 inch diameter quartz wafer, using a 30 second spin at 1,500 rpm. The coated wafers were baked at 90° C. for 30 minutes in a convection oven (this step being referred to as softbaking). Each film was found to be approximately 1 micron in thickness based on replicate measurements with a Dektak IIA Film Thickness Profilometer. The absorbance of each coated wafer at 248 nm was measured with an HP8452A spectrophotometer.

In FIG. 1 of the drawings, absorbancy is plotted as a function of the percent hydrogenation of the resin. An unexpected result of hydrogenation and the elimination of double bonds was the shape of the curve where there is shown a sharp decrease in absorbance at a low level (4%) of hydrogenation, followed by a moderate decrease as a result of further hydrogenation.

EXAMPLE 2

This Example shows that the rate of dissolution of hydrogenated poly(p-vinyl phenols) in an aqueous alkaline developer decreases with an increasing degree of hydrogenation. The four solutions of Example 1 were spin coated and softbaked exactly as in Example 1 but using 2 inch square chrome plates, rather than quartz, as the substrate, in order to permit measurement of film thickness by interferometry. After softbaking and cooling to ambient temperature, the coatings were dissolved in an aqueous alkaline developer (Shipley ® Microposit MF-321 developer) at 25° C. The thickness of the coating was measured initially with a Nanospec/AFT instrument. During development the thickness of the coating was monitored with a helium/neon laser interferometer by means of a fiber optic probe immersed in the developer, permitting measurement of the time required for complete removal of the photoresist. The average rate of dissolution was calculated from the initial thickness of the coating and the time required for complete removal. Average values of four replicate measurements with each polymer solution are plotted in FIG. 2 of the drawings.

The results demonstrate that the dissolution rate decreases with increasing hydrogenation but plateau within the range of about 5 to 15% hydrogenation. Therefore, for the materials of this example, 5 to 15% hydrogenation is a preferred range.

EXAMPLE 3

This Example is the best mode contemplated of this invention.

The materials used to prepare the photoresist for this example are set forth below, in parts by weight:

| | |
|---|---|
| Solvent (diglyme) | 72.00 |
| Poly-(p-vinyl phenol) 10% hydrogenated | 24.90 |
| hexa(methoxymethyl melamine)[a] | 1.86 |
| Photoacid generator[b] | 1.24 |

[a] Cymel 303 (American Cyanamid Co.)
[b] tris(2,3-dibromopropyl)isocyanurate

The photoresist was spin-coated onto bare silicon wafers (vapor-primed with HMDS for 5 minutes) at 4000 rpm for 30 seconds, then softbaked at 110° C. for 60 seconds on a vacuum hotplate, yielding a film of approximately 1 micron thickness. An array of 7 by 7 mm square regions ("pads") was exposed over a range of exposure energies from 4 to 124 mJ/cm$^2$ in steps of 4 mJ/cm$^2$, using a GCA AWIS excimer laser stepper at a wavelength of 248 nm. The coated wafers were then baked ("post-exposure bake") at 100° C. for 60 seconds on a vacuum hotplate to bring about an acid catalyzed crosslinking reaction, and the photoresist was then developed by immersion in Microposit ® MF-312 developer at a concentration of 0.135N for 150 seconds at 25° C. with hand stirring. After rinsing and drying, the thickness of each pad was measured with a Nanospec/AFT as in Example 2, basing the calculations on a photoresist refractive index of 1.64. The results are set forth in FIG. 3 of the drawings in which the abscissa is given in dosage units of 0.4 mJ/cm$^2$.

At the lowest exposure doses the actinic energy was insufficient to crosslink the resist and the resist was completely removed by the developer. Above 16 mJ/cm$^2$ crosslinking proceeded sufficiently to partially insolubilize the exposed portions of the photoresist, and above 80 mJ/cm$^2$ the photoresist was rendered completely insoluble so that the original film thickness was retained.

Figure 3:
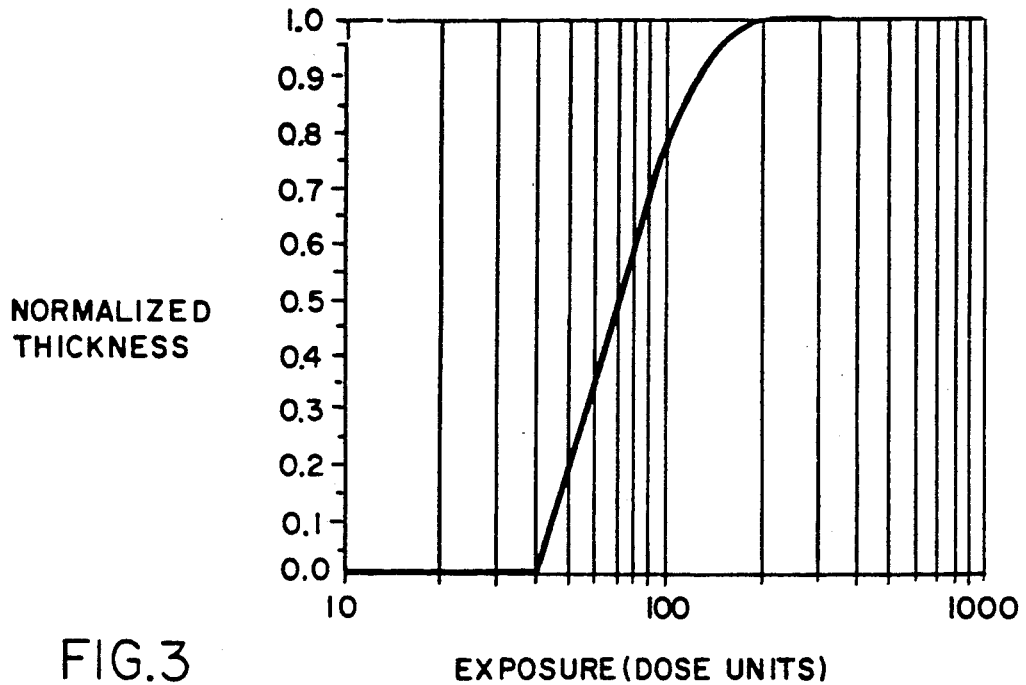
FIG. 3 is a contrast curve for a photoresist prepared using a hydrogenated polyvinyl phenol binder.

From the contrast curve of FIG. 3 of the drawings, the photospeed and contrast of the photoresist may be calculated. For a negative photoresist system, photospeed is defined as the energy necessary to retain 90% of the original thickness. Based on FIG. 3, the photospeed is approximately 60 mJ/cm$^2$. Contrast relates to the slope of the curve. To calculate contrast, the linear portion of the curve is extrapolated to 0 and 1.0 normalized thickness, at exposures of $E_0$ and $E_1$, respectively. The contrast is defined as $1/\log(E_1/E_0)$. For the curve of FIG. 3, the contrast is 2.1. In comparison with other commonly used negative photoresists this is considered a high contrast value. It is known that, in general, the higher the contrast the steeper are the sidewalls of the developed image.

EXAMPLE 4

The photoresist of Example 3 was treated in a manner generally similar to Example 3 but with some differences in the details of the procedure, as follows:

substrate: as in Example 3;
coating: as in Example 3;
softbake: 60 seconds at 90° C. on vacuum hotplate;
exposure: 24 mJ/cm$^2$ under same conditions as Example 3, but with a mask to form evenly spaced lines;
post-exposure bake: 60 seconds at 130° C. on vacuum hotplate; and
development: 90 second immersion in 0.135N MF-312 developer at 25° C. with hand stirring.

The higher temperature of post exposure baking in this Example, compared to Example 3, was chosen in order to bring about a higher degree of crosslinking and a lower solubility of the exposed portions in the developer. Tests similar to those of Example 3 showed that under these conditions the contrast was increased to a value of 4.1.

Photomicrographs were taken by means of scanning electron microscopy (SEM) at 50,000× magnification. As shown in FIG. 4 of the drawings, the mask pattern of lines (shown as ridges of photoresist) of 0.4 micron width at a spacing of 0.4 micron is fairly well reproduced, with some thinning of the lines at the bottom.

EXAMPLE 5

This Example illustrates a positive photoresist based on hydrogenated poly(p-vinyl phenol), activated by deep U.V. radiation. The formulation comprises a hydrogenated poly(p-vinyl phenol) with a relatively high degree of hydrogenation to minimize its solubility. In this formulation, the photoactive compound is used at a sufficiently high concentration so that its decomposition under the influence of actinic radiation renders the photoresist composition much more soluble in the developer than the unexposed photoresist. The materials used are set forth below, in parts by weight:

| Solvent (diglyme) | 69.2 |
| Poly(p-vinyl phenol) 25% hydrogenated | 23.1 |
| Photoactive compound$^a$ | 7.7 |

$^a$2-diazo-1-naphthol-5-sulfonate triester of 2,3,4-trihydroxy benzophenone

The absorbence of deep U.V. radiation at 248 nm was measured in the same way as in Example 1. The unexposed photoresist had an absorbence of 1.96 per micron. After exposure to a radiation dose of 720 mJ/cm$^2$ at 248 nm, the photoresist was partially bleached with the exposed photoresist having an absorbence of 1.65 per micron.

To measure the contrast of this photoresist, 4 inch bare silicon wafers were vapor-primed with HMDS for 5 minutes, then spin-coated with the photoresist for 30 seconds at 5000 rpm, then softbaked for 60 seconds at 90° C. on a vacuum hotplate, yielding a film of 1.17 micron thickness. The coated wafers were exposed for 60 seconds on an HTG Deep U.V. Exposure Unit at 240–260 nm, with a total dose of 720 mJ/cm$^2$. An Optoline mask was used to give 16 successively decreasing dose energies in different regions. The resist was then developed by immersion for 64 seconds in Microposit ® MF-312 Developer (0.135N) at 25° C. with hand stirring. After rinsing and drying, the thickness of each region was measured as in Example 3, basing the calculations on a resist refractive index of 1.64. The results are set forth in FIG. 5.

Figure 5:
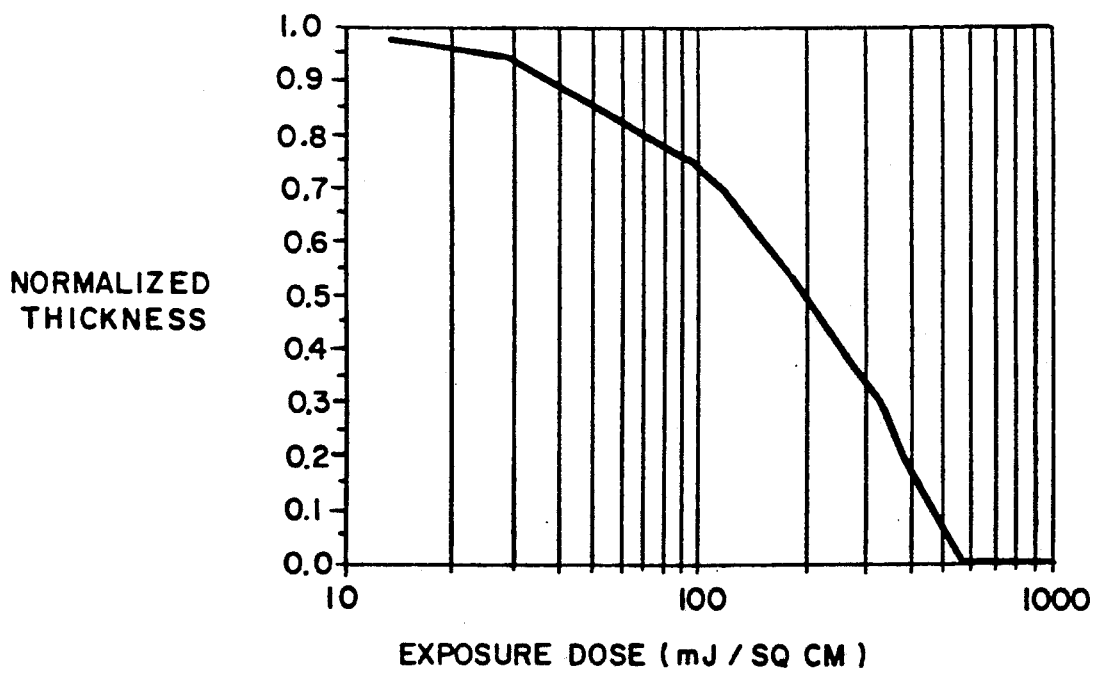
FIG. 5 is a graphical representation of exposure dose as a function of photoresist thickness using a photoresist prepared in accordance with the invention.

FIG. 5 of the drawings shows that the loss of unexposed photoresist due to the development procedure is 3%. The photospeed, defined as the energy required to render the exposed photoresist completely soluble under the conditions of development is 550 mJ/cm$^2$. The contrast, defined as in Example 3, is 1.06. This photoresist has a lower contrast, and requires a much higher exposure dose, than the acid-hardening negative photoresist of Examples 3 and 4, but can be used if a positive photoresist is desired.

We claim:

1. A photoresist composition consisting of an admixture of a resin binder and a light sensitive component, said resin binder comprising a copolymer having a major proportion of phenolic units and a minor proportion of non-aromatic cyclic alcoholic units, said cyclic alcoholic units being present in a concentration of less than 50 mole percent of the total of said binder and being insufficient to prevent development of an exposed coating of the photoresist in a developer for said photoresist, said light sensitive component being present in an amount capable of generating a latent image by exposure of a coating of said photoresist to activating radiation.

2. The photoresist of claim 1 where the copolymer is a random, essentially linear copolymer.

3. The photoresist of claim 2 wherein the light sensitive component is selected from the group of (1) o-quinone diazide sulfonic acid esters and (2) a combination of an aminoplast or phenolplast and a photoactive acid generating compound.

4. The photoresist of claim 3 where the resin binder is a copolymer selected from the group consisting of:

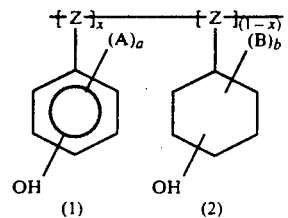

and

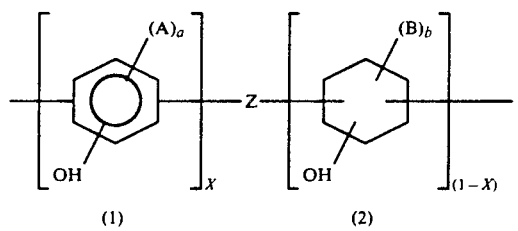

where unit (1) is a phenolic unit and unit (2) is a cyclic alcohol unit; Z is an alkylene bridge having from 1 to 3 carbon atoms; A is a substituent substituted for hydrogen on the ring selected from the group of lower alkyl having from 1 to 3 carbon atoms, halo, alkoxy having from 1 to 3 carbon atoms, hydroxyl, nitro and amino; a is a number varying from 0 to 3; B is a substituent selected from the group of hydrogen, lower alkyl having from 1 to 3 carbon atoms, halo, alkoxy having from 1 to 3 carbon atoms, hydroxyl, nitro and amino, provided that at least 3 of said B substituents are hydrogen; b is a whole, odd integer varying between 6 and 10; and X is the mole fraction of the unit (1) in the copolymer and varies between 0.50 and 0.99.

5. The photoresist of claim 3 where the resin binder is a hydrogenated phenolic resin having a percent hydrogenation varying from about 1 to 30 mole percent.

6. The photoresist of claim 5 where percent hydrogenation varies from 5 and 15 mole percent.

7. The photoresist of claim 5 where the hydrogenated phenolic resin is a hydrogenated novolak resin and the light sensitive component is a naphthoquinone diazide sulfonic acid ester.

8. The photoresist of claim 5 where the hydrogenated phenolic resin is a hydrogenated polyvinyl phenol resin and the light sensitive component is a naphthoquinone diazide sulfonic acid ester.

9. The photoresist of claim 5 where the hydrogenated phenolic resin is a hydrogenated polyvinyl phenol resin and the light sensitive component is a combination of an aminoplast and an acid generating compound.

10. The photoresist of claim 9 where the photoresist is a negative acting photoresist.

11. The photoresist of claim 9 where the aminoplast is a melamine formaldehyde resin.

12. The photoresist of claim 9 where the photoactive generating compound is one that:
(i) selectively absorbs actinic radiation having a wave length in the range of about 350 nm or less;
(ii) is compatible with the acid-hardening resin and the aminoplast or phenolplast;
(iii) is developable in an aqueous based solution;
(iv) is capable, on exposure to actinic radiation having a wavelength in the range of about 350 nm or less, of generating halogen acid for crosslinking the acid-hardening resin system at elevated temperatures to form a thermally stable negative image.

13. The photoresist of claim 12 where the photoactive acid generating compound is 1,1-bis[p-chlorophenyl]-2,2,2-trichloroethane.

14. A photoresist consisting of an admixture of an acid hardening resin system where the resin component of the system is a partially hydrogenated polyvinyl phenol and a photoactive acid generating compound, said polyvinyl phenol component having a major proportion of phenolic groups and a minor proportion of cyclic alcoholic groups, said cyclic alcoholic groups being present in an amount of less than 50 mole percent of the total binder and insufficient to prevent development of an exposed photoresist coating in a developer for said photoresist, said photoactive acid component being present in an amount capable of generating a latent image in a coating of said photoresist following exposure to activating radiation and baking.

15. The photoresist of claim 14 where the cyclic alcoholic groups comprise from 5 and 15 mole percent of the resin.

16. The photoresist of claim 14 where acid hardening resin system is a combination of an aminoplast and said hydrogenated polyvinyl phenol resin.

17. The photoresist of claim 14 where the photoresist is a negative acting photoresist.

18. The photoresist of claim 16 where the aminoplast is a melamine resin.

19. The photoresist of claim 18 where the aminoplast is a melamine formaldehyde resin.

* * * * *